United States Patent
Saito et al.

(10) Patent No.: US 10,748,764 B2
(45) Date of Patent: Aug. 18, 2020

(54) METHOD FOR MANUFACTURING SILICON CARBIDE EPITAXIAL SUBSTRATE AND METHOD FOR MANUFACTURING SEMICONDUCTOR DEVICE

(71) Applicant: FUJI ELECTRIC CO., LTD., Kawasaki (JP)

(72) Inventors: Akira Saito, Yokosuka (JP); Kei Nakajima, Musashino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/234,779

(22) Filed: Dec. 28, 2018

(65) Prior Publication Data
US 2019/0244814 A1    Aug. 8, 2019

(30) Foreign Application Priority Data
Feb. 7, 2018    (JP) .................... 2018-020441

(51) Int. Cl.
*H01L 21/02*    (2006.01)
*H01L 21/04*    (2006.01)
(Continued)

(52) U.S. Cl.
CPC ........ *H01L 21/02694* (2013.01); *C30B 29/36* (2013.01); *C30B 31/22* (2013.01);
(Continued)

(58) Field of Classification Search
CPC ......... H01L 21/02694; H01L 21/02378; H01L 21/02433; H01L 21/02529;
(Continued)

(56) References Cited

U.S. PATENT DOCUMENTS

| | | | |
|---|---|---|---|
| 2009/0317983 A1* | 12/2009 | Miyanagi | ......... H01L 21/02378 438/795 |
| 2011/0203513 A1 | 8/2011 | Watanabe et al. | |
| 2018/0012758 A1 | 1/2018 | Tsuchida et al. | |

FOREIGN PATENT DOCUMENTS

| | | |
|---|---|---|
| JP | 2011-168453 A | 9/2011 |
| JP | 2017-85047 A | 5/2017 |

OTHER PUBLICATIONS

Nakayama, Koji., "A Study on Relationship Between Crystal Defects and Electrical Characteristics in 4H-SiC Bipolar Devices", Osaka University Knowledge Archive, Jan. 2013, 149 pages (Discussed in the Patent Application Specification), Chapter 2 4H-SiC Bipolar Devices and Crystal Defects.

(Continued)

*Primary Examiner* — Feifei Yeung Lopez

(57) ABSTRACT

A method for manufacturing a semiconductor device includes epitaxially growing a carrier-transport layer of a first conductivity type on a substrate of silicon carbide; irradiating the carrier-transport layer with a first light having a wavelength equal to or less than an absorption-edge wavelength of silicon carbide at a temperature of less than 400 degrees Celsius so as to expand a stacking fault originating from a basal plane dislocation which are propagated from the substrate to the carrier-transport layer; heating the carrier-transport layer in which the stacking fault has expanded so as to shrink the stacking fault, at a shrinking temperature of 400 degrees Celsius or more and 1000 degrees Celsius or less; and forming a carrier-injection region of a second conductivity type on the carrier-transport layer, the carrier-injection region injects carriers into the carrier-transport layer.

14 Claims, 14 Drawing Sheets

(51) Int. Cl.
*C30B 31/22* (2006.01)
*C30B 33/02* (2006.01)
*C30B 29/36* (2006.01)
*H01L 29/861* (2006.01)
*H01L 29/868* (2006.01)
*H01L 29/16* (2006.01)

(52) U.S. Cl.
CPC ........ *C30B 33/02* (2013.01); *H01L 21/02378* (2013.01); *H01L 21/02433* (2013.01); *H01L 21/02529* (2013.01); *H01L 21/02576* (2013.01); *H01L 21/02675* (2013.01); *H01L 21/046* (2013.01); *H01L 29/8611* (2013.01); *H01L 29/1608* (2013.01); *H01L 29/868* (2013.01)

(58) Field of Classification Search
CPC ......... H01L 21/02576; H01L 21/02675; H01L 21/046; H01L 29/8611; H01L 29/868; H01L 29/1608; C30B 29/36; C30B 31/22; C30B 33/02
See application file for complete search history.

(56) References Cited

OTHER PUBLICATIONS

Skowronski et al., "Degradation of hexagonal silicon-carbide-based bipolar devices", Journal of Applied Physics vol. 99, Jan. 13, 2006, 25 pages (Discussed in the Patent Application Specification).

Maeda, Koji., "Radiation-Enhanced Dislocation Glide: The Current Status of Research", Materials and Reliability Handbook for Semiconductor Optical and Electron Devices, O. Ueda and S.J. Pearton edits, Springer Science +Business Media, New York, Aug. 2013, pp. 263-281. (Discussed in the Patent Application Specification).

Pirouz, P., et al., "On transition temperatures in the plasticity and fracture of semiconductors", Philosophical Magazine A, vol. 81, No. 5, May 2001, pp. 1207-1227. (Discussed in the Patent Application Specification).

Hirano, R., "Photoluminescence analysis of dislocations in 4H-SiC", Faculty of School and Technology, Keio University, School of Fundamental Science and Technology, Mar. 2013, 47 pages (Discussed in the Patent Application Specification), Dislocations and Stacking Faults in 4H-SiC.

\* cited by examiner

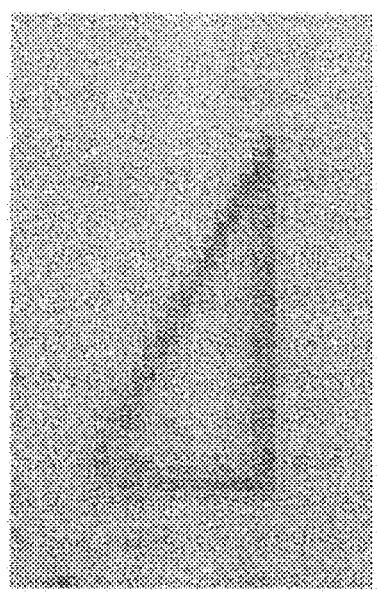
FIG. 3A
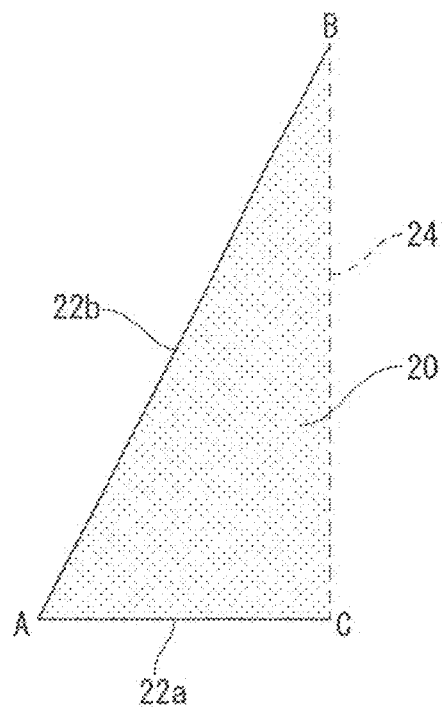
FIG. 3B
FIG. 4
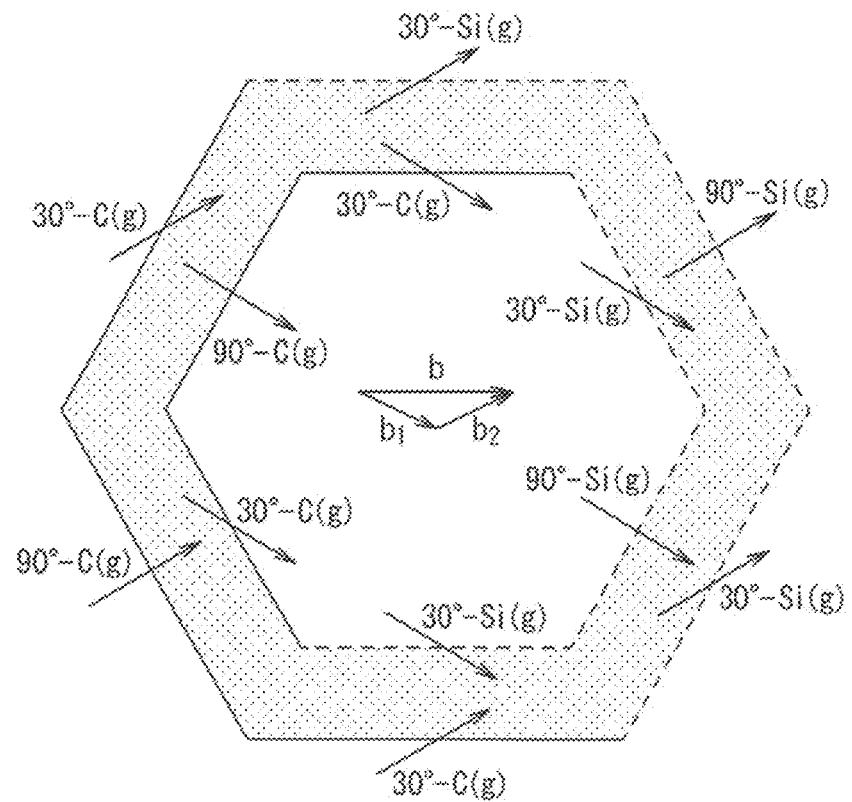

FIG. 7
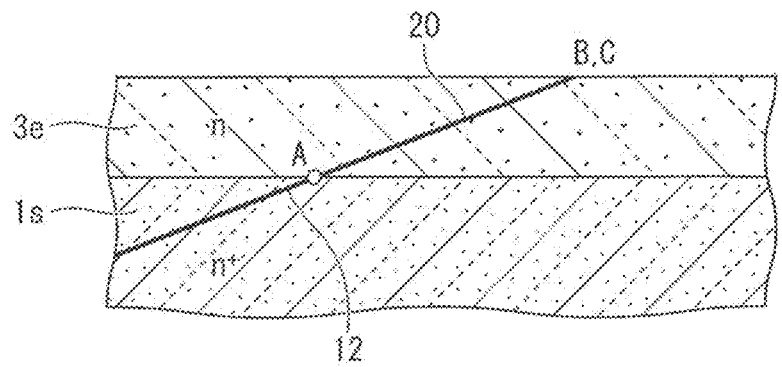
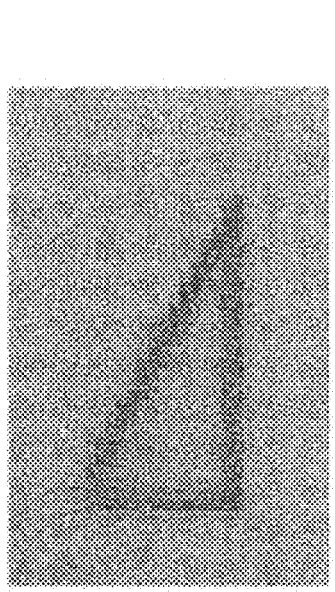
FIG. 8A
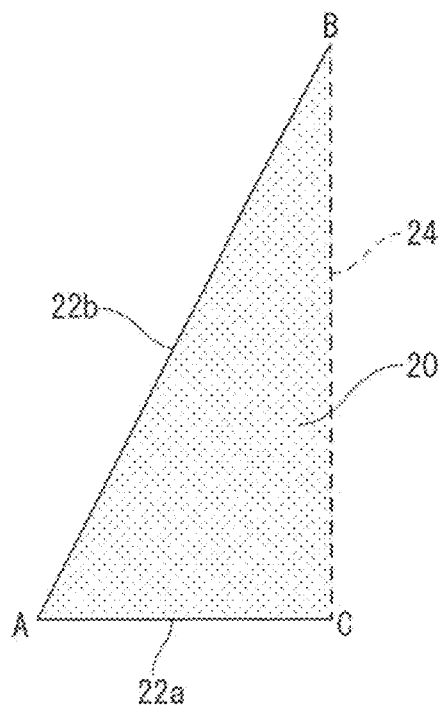
FIG. 8B

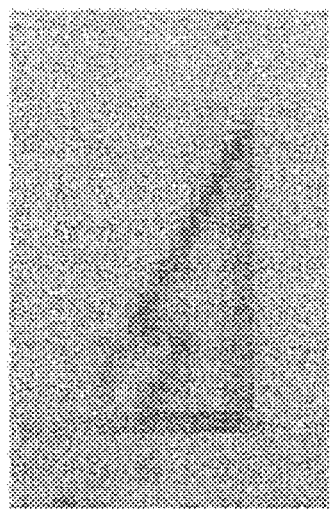
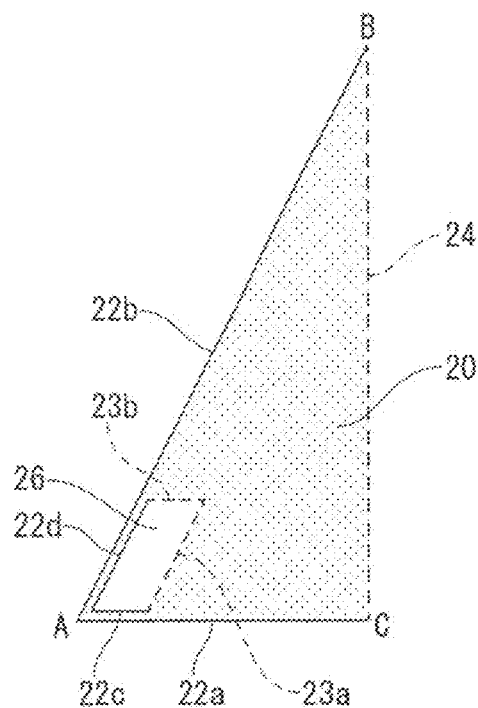
FIG. 9A  FIG. 9B
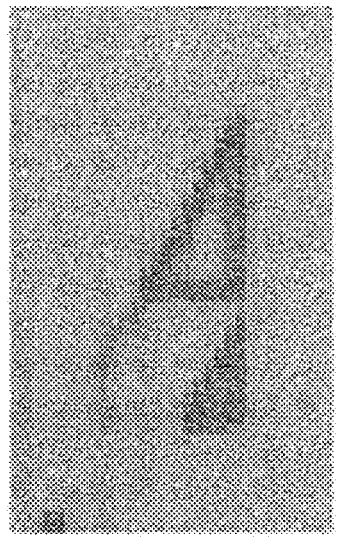
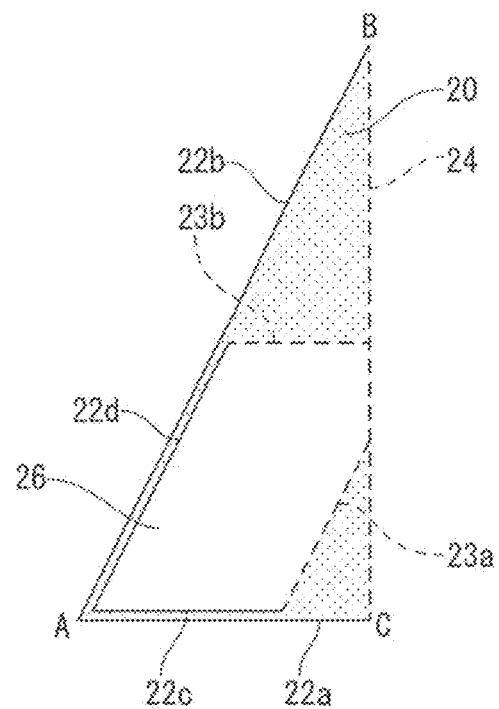
FIG. 10A  FIG. 10B

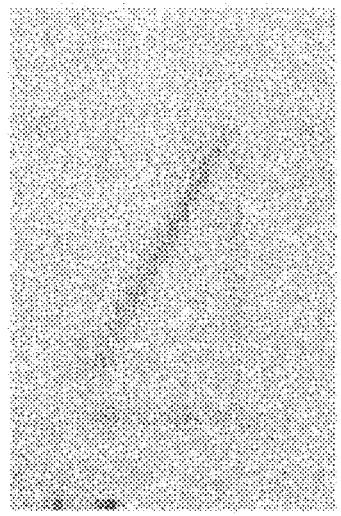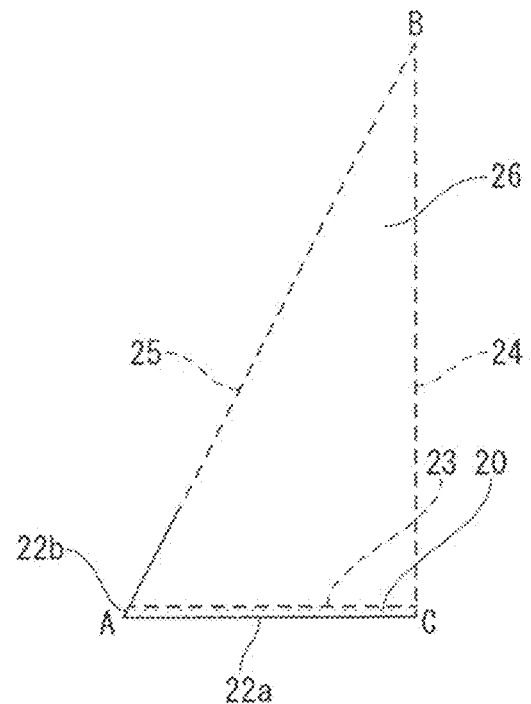
FIG. 15A  FIG. 15B
FIG. 16
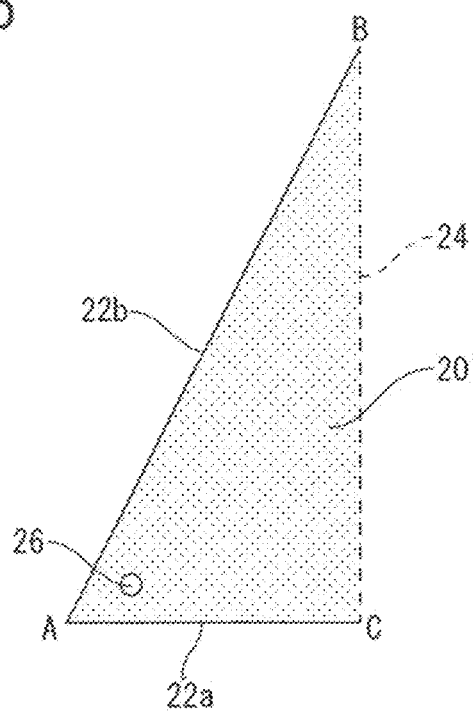

METHOD FOR MANUFACTURING SILICON CARBIDE EPITAXIAL SUBSTRATE AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. P2018-020441 filed on Feb. 7, 2018, the entire contents of which are incorporated herein by reference.

BACKGROUND OF THE INVENTION

1. Field of the Invention

The present invention relates to a method for manufacturing a silicon carbide (SiC) epitaxial substrate and a method for manufacturing a semiconductor device.

2. Description of the Related Art

It is known that an epitaxial substrate of a SiC single crystal contains many stacking faults and adversely affects the characteristics of the semiconductor device. The commercially available SiC substrates include threading screw dislocations (TSDs) and threading edge dislocations (TEDs) which are propagating in the c-axis direction, and basal plane dislocations (BPDs) propagating in the basal plane. Further, many mixed dislocations or dislocation loops, which are complex structures of the screw dislocation and the edge dislocation, are also included. Such dislocations in the substrate continuously propagate into the epitaxial layer during the epitaxial growth. Threading dislocations, such as screw dislocations, edge dislocations and the like, are known to increase leakage currents of SiC semiconductor devices. JP 2011-168453 A discloses a technique of eliminating the screw dislocations from the threading mixed dislocations in a surface region of the substrate to recover crystalline quality by annealing after degrading crystalline quality by ion implantation onto the top surface of the substrate 1s described.

On the other hand, the basal plane dislocations may cause degradation of characteristics of the SiC power device, especially deterioration of forward characteristics. For example, it is known that a forward resistance increases when a forward current flows through a p-i-n diode using a SiC epitaxial substrate. The increase in forward resistance and its mechanism are described in detail in k. Nakayama, "A Study on Relationship Between Crystal Defects and Electrical Characteristics in 4H-SiC Bipolar Devices" (Osaka University, 2013, Ph.D. Thesis), M. Skowronski et al, "Degradation of hexagonal silicon-carbide-based bipolar devices" (J. Appl. Phys., Vol. 99, 2006, p. 011101), and K. Maeda, "Radiation-Enhanced Dislocation Slide: The Current Status of Research" (Materials and Reliability Handbook for Semiconductor Optical and Electron Devices, Springer, 2013, O. Ueda et al (Eds.). p. 263). In particular, M. Skowronski et al, describe in detail each laminated structure of 4H, 6H and 3C which are representative polymorphs (polytypes) of SiC single crystal, and the laminated structure of stacking faults in 4H-SiC. Further, K. Maeda describes in detail the mechanism of expansion from the basal plane dislocation of the 4H-SiC crystal to the stacking fault by light irradiation. Further, P. Pirouz et al., "On transition temperatures in the plasticity and fracture of semiconductors" (Philosophical Magazine, Vol. 81, No. 5, 2001, p. 1207-1227), and R. Hirano, "Photoluminescence analysis of dislocations in 4H-SiC" (Keio University, 2012, Ph.D. Thesis) describe in detail that the expansion of the stacking fault originates from the dislocation loop in the vicinity of the interface between the epitaxial layer and the substrate. The increase in the forward resistance of the p-i-n diode is caused by the expansions of the stacking faults originating from the basal plane dislocations which locate in the drift region of the n-type epitaxial layer. The basal plane dislocations continue from the substrate to the epitaxial layer and reaches the surface through the epitaxial layer. The basal plane dislocations in the drift region may be starting points of the stacking faults by injecting minority carriers which are holes in the n-type epitaxial layer, from the p-type anode region by current flow.

It is known that the conversion of dislocations occurs in the process of the propagation of the dislocations in the substrate into the epitaxial layer. Most of the basal plane dislocations in the substrate convert to the threading dislocations during epitaxial growth and the remaining few propagate into the epitaxial layer as the basal plane dislocations without converting. Since the threading dislocation does not expand to the stacking fault, it is possible to prevent occurrence of the stacking fault by increasing close to 100% the conversion rate of the basal plane dislocation to the threading dislocation in the drift region and further reducing the hole concentration injected into the basal plane dislocations. In addition, JP 2017-85047 A proposes a method for preventing the occurrence of stacking faults by adding secondary dopants that captures minority carriers, to a buffer layer in which primary dopants are added at a high impurity concentration.

However, the conversion rate of the basal plane dislocation to the threading dislocation is almost 95%, and about 5% of the basal plane dislocations remains in the epitaxial layer. Although the basal plane dislocations have converted to the inactive threading dislocations, since the basal plane dislocations at the base of threading dislocation remain near the interface of the substrate in the epitaxial layer, it is difficult to completely eliminate the defects which cause the stacking defect expansion. Furthermore, as to the method of decreasing the hole concentration injected from the p-type anode region by using the buffer layer, a threshold level of the hole concentration at which the basal plane dislocation begins to expand to the stacking fault, largely varies depending on the stress and the like in the substrate. Therefore, in order to prevent expansion of the basal plane dislocations, which have a small threshold level, to the stacking faults, because the flowing current cannot be increased, and the device cannot operate with the ultimate performance capability.

SUMMARY OF THE INVENTION

An aspect of the present invention inheres in a method for manufacturing a semiconductor device, including: (a) epitaxially growing a carrier-transport layer of a first conductivity type on a substrate of silicon carbide; (b) irradiating the carrier-transport layer with a first light having a wavelength equal to or less than an absorption-edge wavelength of silicon carbide at a temperature of less than 400 degrees Celsius so as to expand a stacking fault originating from a basal plane dislocation which are propagated from the substrate to the carrier-transport layer; (c) heating the carrier-transport layer in which the stacking fault has expanded so as to shrink the stacking fault, at a shrinking temperature of 400 degrees Celsius or more and 1000 degrees Celsius or less; and (d) forming a carrier-injection region of a second conductivity type on the carrier-transport layer, the carrier-injection region injects carriers into the carrier-transport layer.

Another aspect of the present invention inheres in a method for manufacturing a silicon carbide epitaxial substrate including: (a) growing an epitaxial layer on a silicon carbide substrate; (b) irradiating the epitaxial layer with a first light having a wavelength equal to or less than an absorption-edge wavelength of silicon carbide at a temperature of less than 400 degrees Celsius so as to expand a stacking fault originating from a basal plane dislocation which is propagated from the substrate to the epitaxial layer; and (c) heating the epitaxial layer in which the stacking fault has expanded so as to shrink the stacking fault, at a shrinking temperature of 400 degrees Celsius or more and 1000 degrees Celsius or less.

BRIEF DESCRIPTION OF THE DRAWINGS

FIG. 3A is a PL image illustrating an example of a stacking fault generated by applying a forward current to a p-i-n diode;

FIG. 3B is a schematic view of the PL image illustrated in FIG. 3A;

FIG. 4 is a schematic view illustrating a dislocation loop formed from a basal plane dislocation in the vicinity of the interface between the substrate and the epitaxial layer, which serves as a starting point of stacking fault illustrated in FIGS. 3A, 3B;

FIG. 7 is a schematic cross-sectional view illustrating how the Si core dislocations illustrated in FIG. 6 reach a top surface of the epitaxial layer from the starting point;

FIG. 8A is a PL image illustrating an example of a shrinking process of an expanded stacking fault in the epitaxial layer;

FIG. 8B is a schematic view of the PL image illustrated in FIG. 8A;

FIG. 9A is a PL image illustrating an example of the shrinking process of the stacking fault in the epitaxial layer, subsequent to FIG. 8A;

FIG. 9B is a schematic view of the PL image illustrated in FIG. 9A;

FIG. 10A is a PL image illustrating an example of the shrinking process of the stacking fault in the epitaxial layer, subsequent to FIG. 9A;

FIG. 10B is a schematic view of the PL image illustrated in FIG. 10A;

FIG. 15A is a PL image illustrating an example of the shrinking process of the stacking fault in the epitaxial layer, subsequent to FIG. 14A;

FIG. 15B is a schematic view of the PL image illustrated in FIG. 15A;

FIG. 16 is a schematic view of a PL image illustrating another example of a shrinking process of a stacking fault in the epitaxial layer;

DETAILED DESCRIPTION

Figure 1:
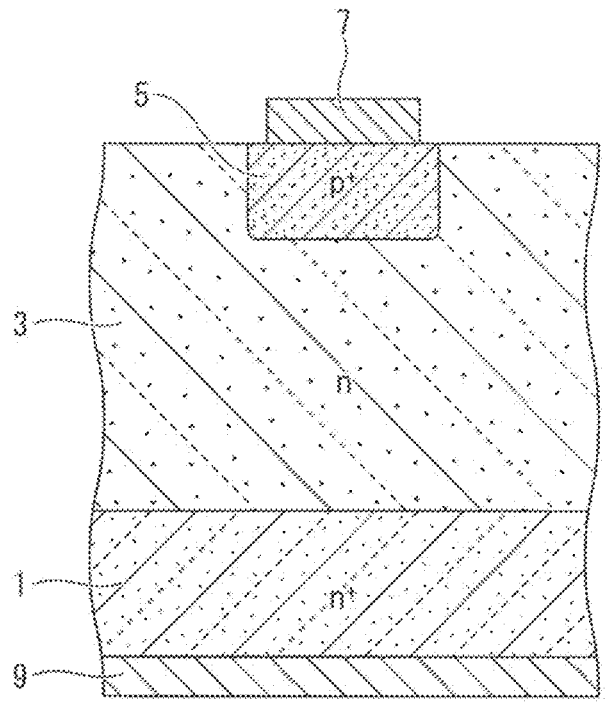
FIG. 1 is a schematic cross-sectional view illustrating an example of a semiconductor device used for describing an embodiment of the present invention.

Hereinafter, embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the present invention is based on the material, shape, structure, arrangement or the like to the following ones.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top". In the following descriptions, the case where a first conductivity type is n-type and a second conductivity type is p-type will be exemplarily described. However, it is also possible to select the conductivity type in an inverse relationship so that the first conductivity type is p-type and the second conductivity type is n-type. In addition, the superscript "+" or "−" added to the mark "n" or "p" denotes that a semiconductor region has relatively high or low impurity concentration as compared with a region without the superscript "+" or "−" added. It should be noted that semiconductor regions denoted by the same mark, such as "n", do not necessarily have exactly the same impurity concentration. In addition, in the specification, "−" in the Miller index notation denotes a bar on top of the following Miller index, and a negative index is denoted with adding "−" before the index.

In the following description, a p-i-n diode is used as a typical example of a semiconductor device, but the semiconductor device of the present invention is not limited to the p-i-n diode. For example, the semiconductor device may be a bipolar device, such as an insulated gate bipolar transistor (IGBT), a static induction (SI) thyristor, a gate turn-off (GTO) thyristor, and the like, in which a forward current flows through the p-n junction. Further, the semiconductor device may be a metal-oxide-semiconductor (MOS) field effect transistor (FET), a metal-insulator-semiconductor (MIS) FET, a MOS static induction transistor (SIT), a MISSIT or the like having a drain region epitaxially grown on a substrate, the MOSFET, the MISFET, the MOSSIT, the MISSIT may include a body diode, or a parasitic diode.

(Configuration of Main Part of Semiconductor Device)

As illustrated in FIG. 1, a semiconductor device according to an embodiment of the present invention includes a first conductivity type ($n^+$-type) carrier-extraction layer 1, an n-type carrier-transport layer 3 in which carriers to be emitted from the carrier-extraction layer 1 drift with a drift electric field, and a second conductivity type ($p^+$-type) carrier-injection region 5 which injects carriers into the carrier-transport layer 3. The carrier-extraction layer 1 extracts the transported carriers through the carrier-transport layer 3 toward an external circuit. The $p^+$-type carrier-injection region 5 may be selectively buried in an upper portion of the n-type drift layer 3 so as to form a $p^+$-n junction, which implements a potential barrier for controlling carrier injection. In the exemplified structure illustrated in FIG. 1, the carrier-extraction layer 1 of a semiconductor substrate may be assigned as a "cathode region", and the carrier-transport layer 3 implemented by the epitaxial layer, which is epitaxially grown on the carrier-extraction layer 1, may be assigned as a "drift region" in which the carriers implementing a main current flow by drifting. Then, the carrier-injection region 5 may be assigned as an "anode region". Thus, a cathode electrode 9 is provided on a lower surface of the carrier-extraction layer 1, and the carriers transported to the carrier-extraction layer 1 are extracted to the external circuit via the cathode electrode 9. An anode electrode 7 is provided on a top surface of the carrier-injection region 5 as an ohmic electrode, and the carriers are supplied to the carrier-injection region 5 from an external circuit via the anode electrode 7. Since the carrier-transport layer 3 has a low impurity concentration close to a concentration level of an intrinsic semiconductor, the carrier-transport layer 3 may be regarded as an "i-layer". Therefore, the $p^+$-type carrier-injection region 5, the i-type carrier-transport layer 3 and the $n^+$-type carrier-extraction layer 1 implement a structure of a "p-i-n diode".

The carrier-extraction layer 1, and the carrier-transport layer 3, which is epitaxially grown on the carrier-extraction layer 1, and the carrier-injection region are made of SiC crystals. The upper surface of the carrier-extraction layer 1 is a (0001)Si-plane and has an off-angle of approximately 0 degrees to 8 degrees toward a <11-20> direction with respect to the <0001> direction or a c-axis. The carrier-transport layer 3, which is epitaxially grown on the carrier-extraction layer 1, and the carrier-injection region 5 also have the same off-angle as the carrier-extraction layer 1. An n-type impurity in the carrier-transport layer 3 is, for example, nitrogen (N) and an impurity concentration of the carrier-transport layer 3 is in a range of approximately $1 \times 10^{15}$ per cubic centimeter to $1 \times 10^{18}$ per cubic centimeter. A thickness of the carrier-transport layer 3 is in a range of one micrometer to several hundreds micrometers. The optimum thickness and the optimum impurity concentration are selected according to the breakdown-voltage specification of the p-i-n diode. The Impurities of the conductivity-type opposite to the impurities of the carrier-transport layer 3 are selectively added to the upper portion of the carrier-transport layer 3 to form a $p^+$-n junction with the carrier-injection region 5 and the carrier-transport layer 3. The anode electrode 7 may include a contact layer, a barrier metal layer, a surface electrode layer and the like. For example, the contact layer may be a nickel silicide ($NiSi_x$) film, the barrier metal layer may be a titanium nitride (TiN) film, and the surface electrode layer may be an aluminum (Al) film. As the cathode electrode 9, for example, a single-layer film made of gold (Au) or a metallic film, which is laminated in the order of Al, nickel (Ni), and Au, may be used.

The SiC crystal has polymorphs, or polytypes, and the main polytypes are a 3c cubic crystal and 4H, 6H hexagonal crystals. Forbidden band widths at room temperature are reported to be 2.23 electron volts for 3C-SiC, 3.26 electron volts for 4H-SiC and 3.02 electron volts for 6H-SiC, respectively. In the embodiment of the present invention, description will be made using the 4H-SiC.

Figure 2:
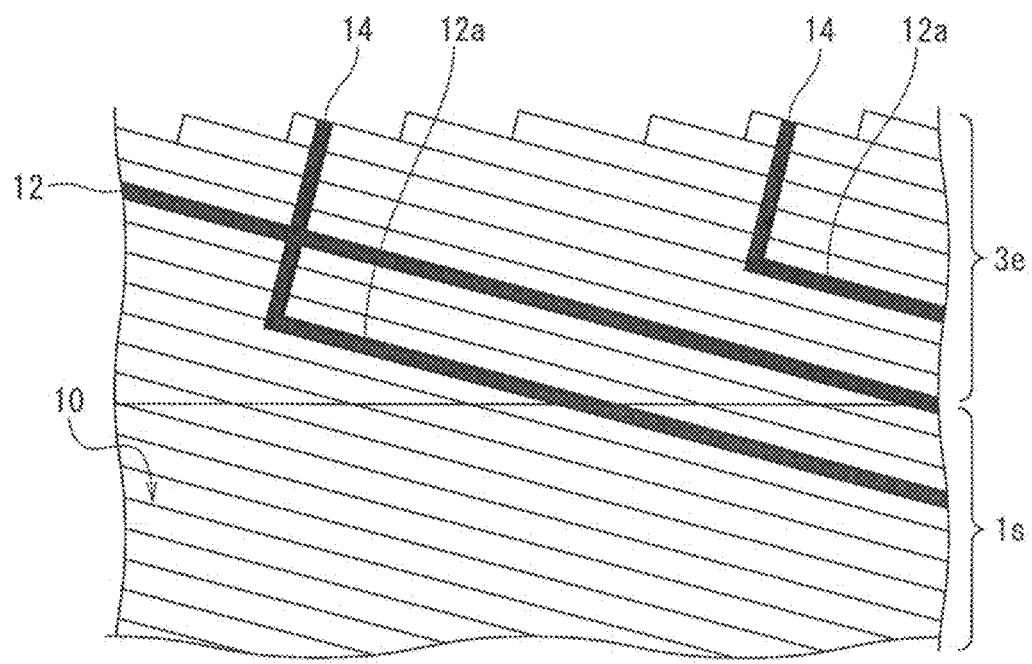
FIG. 2 is a schematic cross-sectional view illustrating examples of dislocation defects in the vicinity of an interface between a substrate and an epitaxial layer.

An increase in a forward resistance of the p-i-n diode is caused by development of the stacking faults which originate from basal plane dislocations 12 residing in an epitaxial layer 3e as illustrated in FIG. 2. More specifically, minority carriers are injected from the $p^+$-type carrier-injection region 5 illustrated in FIG. 1 into an electronic-state level produced by the stacking fault in the n-type epitaxial layer 3e. In the n-type carrier-transport layer 3 illustrated in FIG. 1, holes are injected from the carrier-injection region 5 as "minority carriers". It is known that the electronic-state level of the stacking fault is located 0.2 eV to 0.3 eV below the conduction-band bottom of the 4H-SiC crystal. Electrons in the conduction band generated by current flow or photoexcitation recombine with holes at the electronic-state levels of the stacking faults causing the stacking-fault development. The basal plane dislocations 12 in the substrate 1s are induced by stress relaxation inside the crystal, which is caused by the non-uniformity of the temperature during manufacturing the substrate, and the basal plane dislocations 12 are contained with approximately 1000 per square centimeter in the substrate 1s. As illustrated in FIG. 2, the basal plane dislocations 12 extends from the substrate 1s to the epitaxial layer 3e, and penetrates the epitaxial layer 3e to reach the surface of the epitaxial layer 3e. In manufacturing a p-i-n diode using such epitaxial substrate (1s, 3e), the basal plane dislocations 12 in the epitaxial layer 3e may be starting points for expansion of the stacking faults by current flow. That is, holes are injected into the epitaxial layer 3e from a p-type injection region implementing an anode region, so that the basal plane dislocations 12 may be the starting points for expansion of the stacking faults.

On the other hand, the basal plane dislocations 12a propagates from the substrate 1s to the epitaxial layer 3e, but in the epitaxial layer 3e, the basal plane dislocations 12a is converted into threading dislocations 14 which are parallel to the c-axis of the SiC crystal. The threading dislocations 14 do not develop to the stacking faults. However, in the structure illustrated in FIG. 1, when the holes injected from the p-type carrier-injection region 5 reach the vicinity of the interface between the carrier-extraction layer 1 and the carrier-transport layer 3, the stacking-fault development may occur. In FIG. 2, when the injected holes reach the vicinity of the interface between the substrate 1s and the epitaxial layer 3e, the holes are injected into the electronic-state levels of the stacking faults which begin from the basal plane dislocations 12a. It is reported that the stacking faults beginning from the basal plane dislocations 12a may develop with a hole concentration of $1 \times 10^{15}$ per cubic centimeter or more near the interface between the substrate 1s and the epitaxial layer 3e.

The mechanism in which the basal plane dislocation develops to the stacking fault will be described below. Before measurement, resistance in the forward direction is increased by applying a certain amount of forward current to a p-i-n diode manufactured by the usual method. FIG. 3A illustrates a photoluminescence (PL) image obtained by irradiating a surface of the p-i-n diode with an ultraviolet (UV) light, and FIG. 3B is a schematic drawings of the PL image. The PL includes both fluorescence and phosphorescence processes and results from absorption and luminescence processes between different electronic energy levels in the material. As illustrated in FIG. 3B, on the surface of the epitaxial layer 3e, a stacking fault 20 develops to an intersection line-segment B-C from the basal plane dislocation as the starting point A, which is present in the vicinity of the interface between the substrate 1s and the epitaxial layer 3e. The PL image has a triangle shape in which an angle of ∠ABC is approximately 30 degrees and an angle of ∠BAC is approximately 60 degrees. Line-segments A-B and A-C surrounding the stacking fault 20 are partial dislocations (PDs) formed by carbon (C)-cores 22b, 22a. Hereinafter, Each of C-cores 22a, 22b is "30°-C(g)", in which the angle between the Burgers vector and the dislocation line is 30 degrees and a glide plane is a slipping plane.

As illustrated in FIG. 4, the stacking fault having the triangle shape develops from a dislocation loop which is present near the interface between the epitaxial layer 3e and the substrate 1s (see P. Pirouz et al. and R. Hirano). The PL image is a structure observed from the Si surface of 4H-SiC, and the Burgers vector b representing the distortion resulting from the dislocation is b=(1/3)[11-20]. It is known that the perfect dislocation having the Burgers vector b of the closest packing structure dissociates into two partial dislocations having the Burgers vectors b1 and b2. The Burgers vectors b1 and b2 are (1/3) [10-10] and (1/3) [01-10], respectively:

$$(1/3)[11\text{-}20]=(1/3)[10\text{-}10]+(1/3)[01\text{-}10].$$

The inside and outside of the hexagonal partial dislocation correspond to the Burgers vectors b1 and b2, respectively. Here, portions illustrated in FIG. 4 by broken lines in the partial dislocation loop denote a silicon (Si)-core, and "30°-Si(g)" denotes that the angle between the Burgers vector of partial dislocation and the dislocation line orientation is 30 degrees. The term (g) denotes that the glide plane is a slipping plane of dislocation. Portions illustrated in FIG. 4 by solid lines in the partial dislocation loop denote the C-core. The dislocation which is parallel to the perfect dislocation having the Burgers vector b dissociates into two 30-degree partial dislocations and the dislocation which is not parallel to the perfect dislocation having the Burgers vector b dissociates into 30-degree partial dislocation and 90-degree partial dislocation. The Si-core has a Si—Si bond and the C-core has a C—C bond. Since the energy of the Si—Si bond is smaller than the energy of the C—C bond, the partial dislocation having the Si-core is mobile by current flow, but the partial dislocation having the C-core is immobile.

Figure 5:
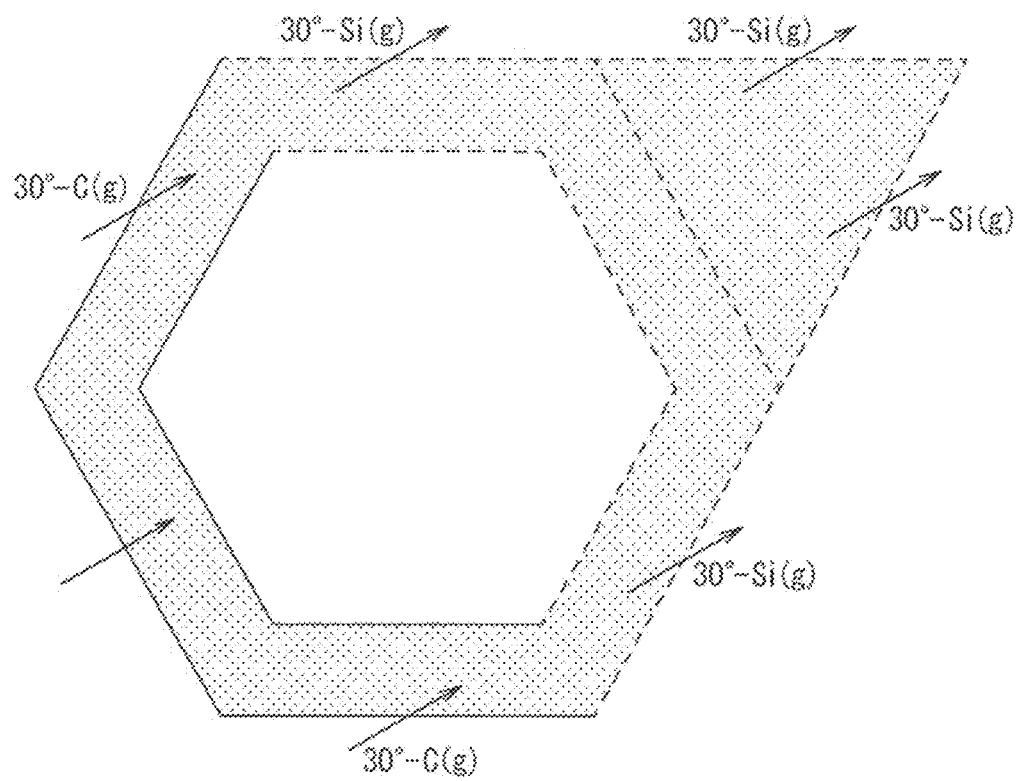
FIG. 5 is a schematic view for explaining that the Si core dislocations in the dislocation loop illustrated in FIG. 4, move in a Burgers vector direction.
Figure 6:
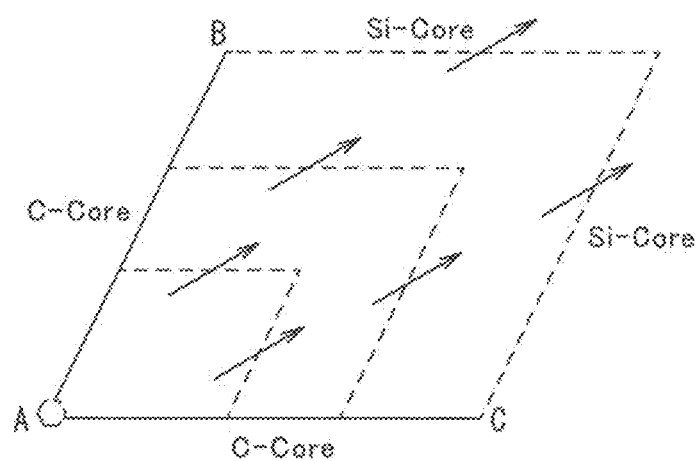
FIG. 6 is a schematic view illustrating how the Si core dislocations illustrated in FIG. 5 expand.

FIGS. 5 to 7 are diagrams for illustrating how the stacking fault 20 develops from the dislocation loop as the starting point A, which dissociates into the partial dislocations from the basal plane dislocation 12 illustrated in FIG. 2, to form a triangle-shape. The dislocation loop has a size of about several hundred nanometers and resides in the basal plane near the interface between the substrate 1s and the epitaxial layer 3e. FIG. 5 illustrates the case where the Si-core of the partial dislocation loop which is the outside of the dislocation loop, has moved in a direction of the Burgers vector of the partial dislocation. Here, a dislocation line of 90°-Si(g) partial-dislocation disappears because the 90°-Si(g) partial-dislocation has a higher moving speed compared to the 30°-C(g) dislocation. Thus, as illustrated in FIG. 6, the stacking fault develops with a rhombus-shape. However, since the plane where the basal plane intersects with the epitaxial layer 3e is limited to a belt-shape, the stacking fault 20 expands in shape from the rhombus-shape to the triangle-shape. For example, when a thickness of the epitaxial layer 3e is about ten micrometers, a width of the belt is about 140 micrometers. It is noted that the width of the belt obtained by projecting anyone of the basal planes in the epitaxial layer 3e on the 4-degree-off substrate 1s to the surface of the epitaxial substrate (1s, 3e) is (10/tan 4) micrometers, that is, about 140 micrometers.

With reference to FIGS. 8A to 15A and FIGS. 8B to 15B, processes of shrinking the stacking fault which is completely expanded to a triangular stacking fault in the epitaxial substrate (is, 3e) by current flow, will be described. FIGS. 8A to 15A are photos of PL images of stacking faults, and FIGS. 8B to 15B are schematic drawings for describing shrinking the stacking fault. The stacking fault may shrink by raising the epitaxial substrate (is, 3e) to a shrinking temperature of about 400 degrees Celsius or more and keeping the temperature after completely expanding to the triangular stacking fault from the base plane dislocation as the starting point A. With regard to the shrunk stacking fault, there are two types of stacking faults, that is, first one does not re-expand by current flow or light irradiation, and second one re-expands by current flow or light irradiation.

Figure 11A:
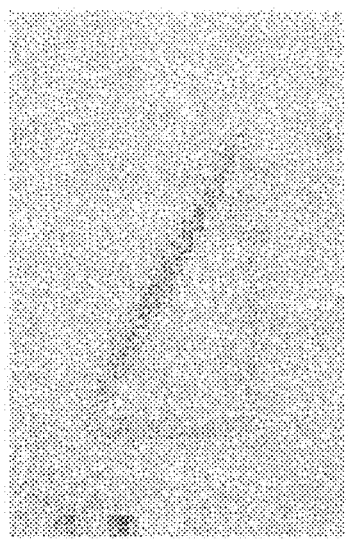
FIG. 11A is a PL image illustrating an example of the shrinking process of the stacking fault in the epitaxial layer, subsequent to FIG. 10A.
Figure 11B:
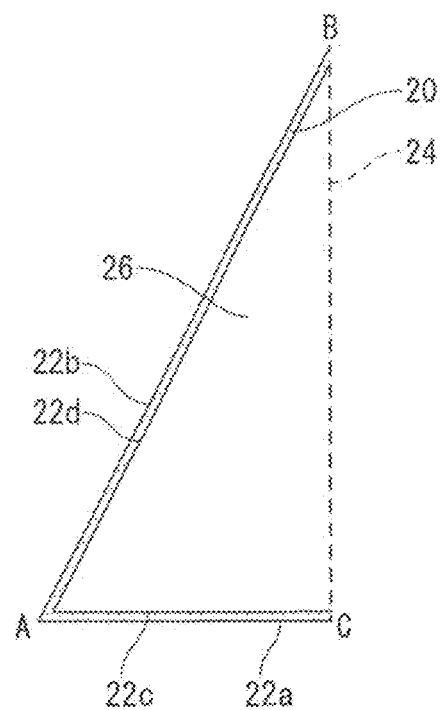
FIG. 11B is a schematic view of the PL image illustrated in FIG. 11A.

In FIGS. 8A to 11A and FIGS. 8B to 11B, the first type where the shrunk stacking fault does not re-expand, will be described. FIG. 8A illustrates a step where the stacking fault 20 is completely expanded to the triangle shape by movement of the 30°-Si(g) partial-dislocations. As illustrated in FIG. 8B, a side AC and a side AB are the C-core 22a and the C-core 22b, respectively, and a side BC is a surface end 24 on the epitaxial layer 3e. As illustrated in FIGS. 9A and 9B, when the stacking fault 20 is heated and held at a shrinking temperature of approximately 400 degrees Celsius or more, a crystallized region 26 of 4H-SiC having a parallelogram shape is appeared near the starting point A. Since the partial dislocations 23a, 23b at boundaries between the stacking fault 20 and the crystallized region 26 are mobile, the partial dislocations 23a, 23b are the Si-cores. On the other hand, the partial dislocations 22c, 22d is immobile and are the C-cores. As illustrated in FIGS. 10A and 10B, the crystallized region 26 further is developing toward the surface of the epitaxial layer 3e and partly reaches a position to be the surface end 24 of the epitaxial layer 3e, to reduce the area of the stacking fault 20. As illustrated in FIGS. 11A and 11B, the crystallized region 26 continues to expand, and the stacking fault 20 almost disappears. As illustrated in FIGS. 9B and 10B, in the stacking fault 20, the crystallized region 26 of 4H-SiC surrounded by the partial dislocations 23a, 23b of the Si-cores and the partial dislocations 22c, 22d of the C-cores are formed. The crystallized region 26 is developing by the movement of partial dislocations 23a, 23b of the Si-cores. As illustrated in FIG. 11B, the crystallized region 26 expands within the stacking fault 20 until the Si-cores reach the surface edge 24. As a result, the shrunk stacking fault 20 is surrounded by partial dislocations 22a, 22b, 22c, 22d of the C-cores, and thus, the stacking fault 20 is immobilized. It is possible to confirm whether or not the crystallized region 26 is formed, by monitoring PL emission from the stacking fault 20 using a band pass filter or the like that transmits light having a wavelength near the PL emission wavelength of 428 nanometers.

Figure 12A:
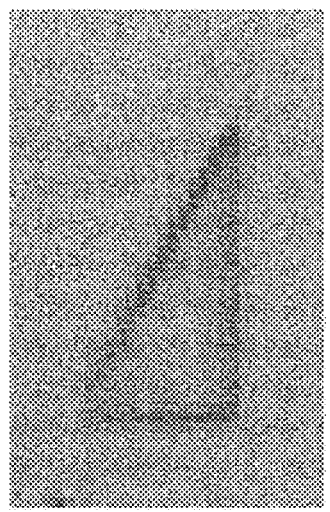
FIG. 12A is a PL image illustrating an example of the shrinking process of the stacking fault in the epitaxial layer, subsequent to FIG. 11A.
Figure 12B:
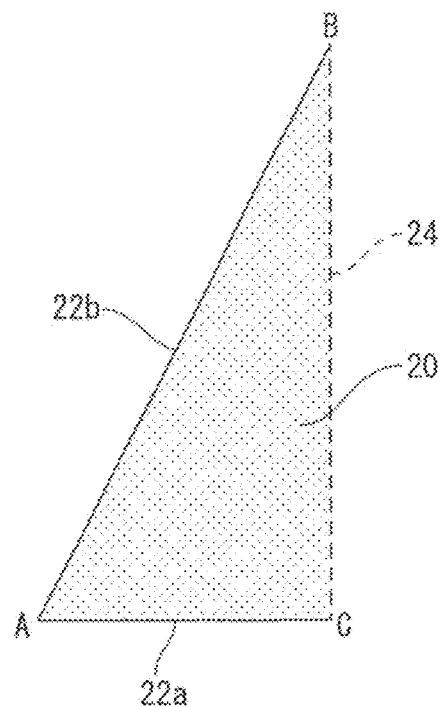
FIG. 12B is a schematic view of the PL image illustrated in FIG. 12A.
Figure 13A:
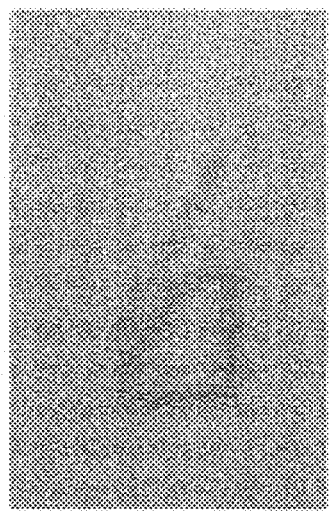
FIG. 13A is a PL image illustrating an example of the shrinking process of the stacking fault in the epitaxial layer, subsequent to FIG. 12A.
Figure 13B:
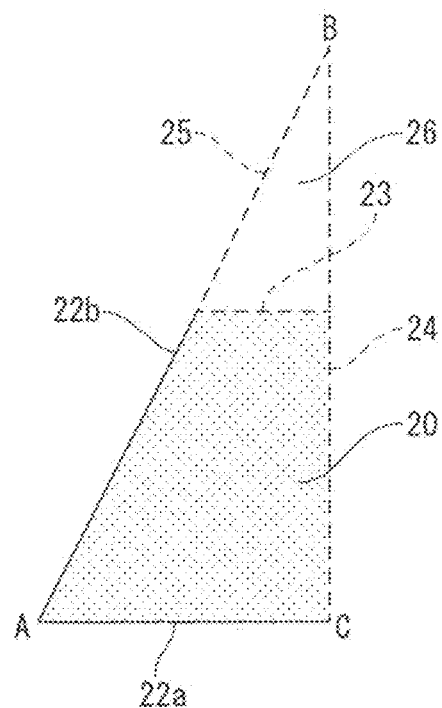
FIG. 13B is a schematic view of the PL image illustrated in FIG. 13A.
Figure 14A:
FIG. 14A is a PL image illustrating an example of the shrinking process of the stacking fault in the epitaxial layer, subsequent to FIG. 13A.
Figure 14B:
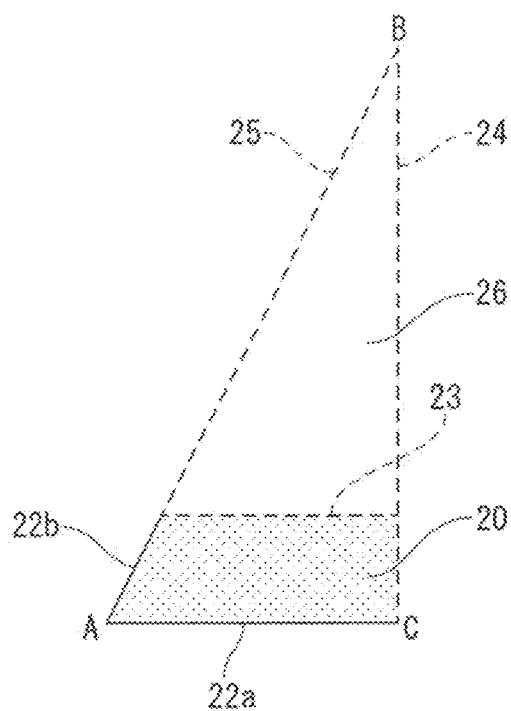
FIG. 14B is a schematic view of the PL image illustrated in FIG. 14A.

In FIGS. 12A to 15A and FIGS. 12B to 15B, the second type where the shrunk stacking fault re-expands, will be described. FIG. 12A illustrates a step where the stacking fault 20 is completely expanded to the triangle-shape by movement of the 30°-Si(g) partial-dislocations. As illustrated in FIG. 12B, the side AC and the side AB are the C-core 22a and the C-core 22b, respectively, and the side BC is the surface end 24 on the epitaxial layer 3e. As illustrated in FIGS. 13A and 13B, when the stacking fault 20 is heated and held at the shrinking temperature of approximately 400 degrees Celsius or more, a crystallized region 26 of 4H-SiC having a triangular-shape is appeared. The crystallized region 26 is surrounded by the partial dislocation 23 of the Si-core, a part of the surface end 24, and a boundary 25. The boundary 25 is a trail of the stacking fault 20. As illustrated in FIGS. 14A and 14B, the partial dislocation 23 moves in a direction opposite to the direction in which the stacking fault 20 has expanded, whereby the crystallized region 26 develops. As illustrated in FIGS. 15A and 15B, the crystallized region 26 continues to develop and the stacking fault 20 is minimized. The second type of stacking fault 20 may expand again by irradiating UV light. As illustrated in FIG. 15B, although the stacking fault 20 has shrunk to a very narrow region, the stacking fault 20 is surrounded with the partial dislocations 22a, 22b of the immobile C-cores and the partial dislocation 23 of the mobile Si-core. Therefore, by irradiation of UV light, holes are injected into the electronic level of the stacking fault 20, so that the partial dislocation 23 of the Si-core moves again in the direction in which the stacking fault 20 has expanded.

At ordinary temperature, for example, five degrees Celsius to 35 degrees Celsius, the energy level of the stacking fault 20 is higher than the energy level of the crystallized region 26 of 4H-SiC. Even at the ordinary temperature, under the condition that minority carriers, which are holes for n-type, are constantly injected into the stacking fault 20 by current flow or light irradiation, the energy level of the crystallized region 26 increases more than the energy level of the stacking fault 20. However, under the condition where the temperature is raised to 400 degrees Celsius or more, the energy level of the crystallized region 26 decreases lower than the energy level of the stacking fault 20 even during applying current flow or light irradiation. Therefore, by irradiating the stacking fault 20 with light in the elevated temperature state, it is possible to transform the stacking fault 20 to the crystallized region 26 of 4H-SiC.

As illustrated in FIG. 16, under the condition where the temperature of the epitaxial substrate (1s, 3e) is raised to 400 degrees Celsius or higher, the crystallized region 26 is formed by irradiating the stacking fault 20 with a laser beam in a spot-shape, the beam having a wavelength equal to or less than the absorption edge wavelength of 4H-SiC. In such case, the crystallized region 26 corresponds to the irradiation position of the laser beam having the spot shape. For example, the beam diameter of the laser beam is one micrometer to ten micrometers. In the example illustrated in FIG. 16, the stacking fault 20 has a side length ratio of AC:AB:BC=one:(square root of three):two. In a case where a 4-degree-off substrate 1s used, if the thickness of the epitaxial layer is ten micrometers, the length of the shortest side AC is about 140 micrometers. Therefore, it is possible to irradiate the interior of the stacking fault 20 with the laser beam having the beam diameter of one micrometer to ten micrometers to form the crystallized region 26 of 4H-SiC, because the beam diameter is sufficiently small compared with the size of the stacking fault 20. In FIG. 16, a corner portion near the starting point A which is a triangle shape having an angle of 60 degrees, has been irradiated with the laser beam. However, as long as the irradiation position is inside the stacking fault 20, the irradiation position may be in the vicinity of the center of gravity of the stacking fault 20. Further, the laser beam may be applied in a plane on the region including the stacking fault 20 without focusing in a spot shape. In this case, since the entire stacking fault 20 is irradiated with light, the position where the crystallized region 26 is formed is undefined.

Figure 17:
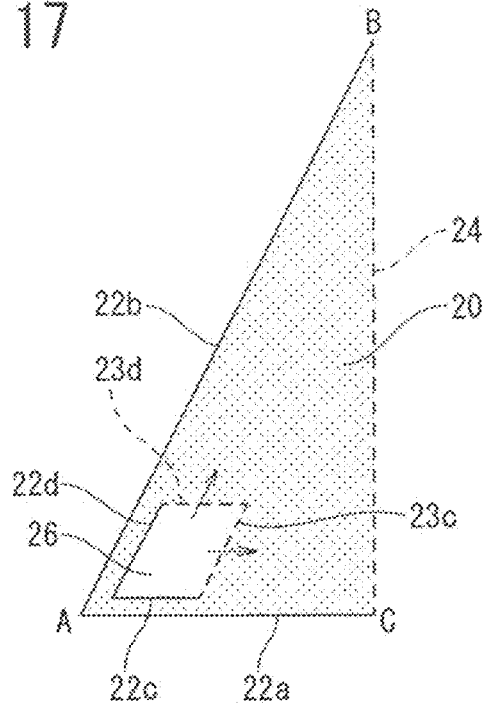
FIG. 17 is a schematic view of a PL image illustrating the another example of the shrinking process of the stacking fault in the epitaxial layer, subsequent to FIG. 16.

By keeping the epitaxial substrate (1s, 3e) at the shrinking temperature of about 400 degrees Celsius or higher, the crystallized region 26 illustrated in FIG. 17 may expand.

Figure 18:
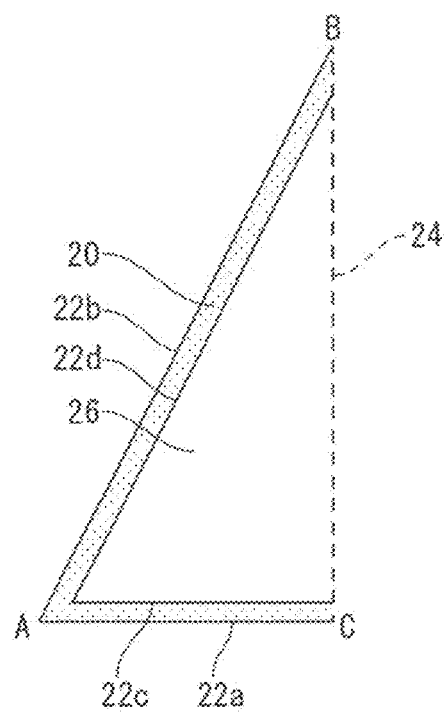
FIG. 18 is a schematic view of a PL image illustrating the another example of the shrinking process of the stacking fault in the epitaxial layer, subsequent to FIG. 17.

The crystallized region 26 is surrounded by partial dislocations 22c and 22d of the C-cores and the partial dislocations 23c and 23d of the Si-cores. The partial dislocations 22c and 22d of the C-cores is immobile and the partial dislocations 23c and 23d of the Si-core mobile. As illustrated in FIG. 18, the crystallized region 26 expands within the stacking fault 20 until the partial dislocations 23c, 23d of the Si-cores reach the surface edge 24. As a result, according to the embodiment of the present invention, the shrunk stacking fault 20 can be immobilized since the shrunk stacking fault 20 is surrounded by partial dislocations 22a, 22b, 22c, 22d of the C cores.

(Manufacturing Method for Semiconductor Device)

Next, with reference to the flowchart illustrated in FIG. 19, a method of manufacturing a semiconductor device according to the embodiment of the present invention will be described with reference to process diagrams illustrated in FIGS. 20 to 23, using a p-i-n diode as an example. It should be noted that the manufacturing method of the p-i-n diode described below is merely an example, and it can be achieved by various other manufacturing methods including modifications as far as the scope of gist described in the claims.

Figure 19:
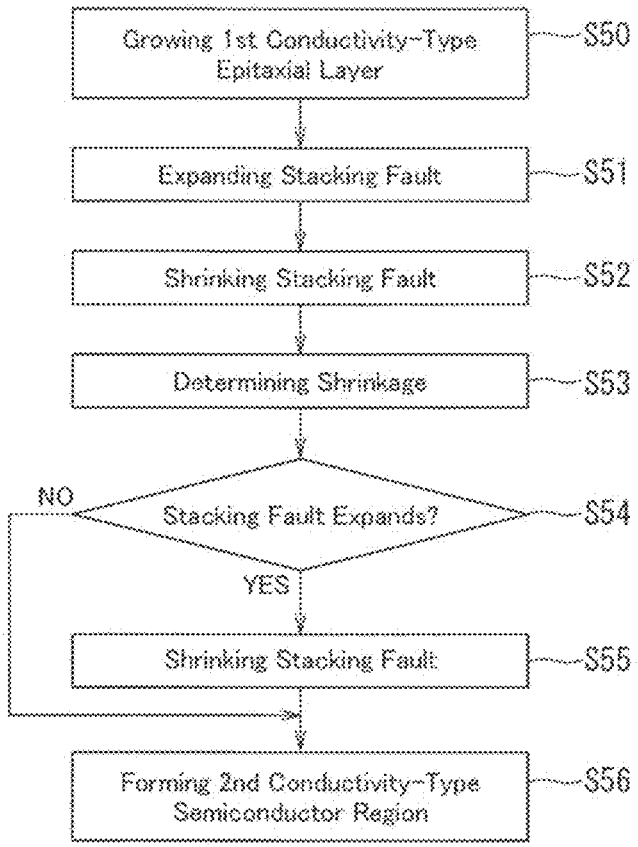
FIG. 19 is a flowchart illustrating an example of a method for manufacturing a semiconductor device according to the embodiment of the present invention.

In Step S50 illustrated in FIG. 19, an epitaxial substrate (is, 3e) having an n$^+$-type substrate 1s of 4H-SiC crystal and an n-type epitaxial layer 3e, which has been epitaxially grown on the n$^+$-type substrate 1s, is prepared. The substrate 1s is a (0001)Si plane in which a principal surface is off by four degrees in the <11-20> direction. The epitaxial layer 3e is doped with n-type impurity atoms, such as nitrogen (N) and the like, at an impurity concentration of about $1 \times 10^{15}$ per cubic centimeter to $1 \times 10^{18}$ per cubic centimeter. A thickness of the epitaxial layer 3e is in a range of one micrometer to several hundreds micrometers. In the following description, the thickness of the epitaxial layer 3e will be assumed to be ten micrometers.

Figure 20:
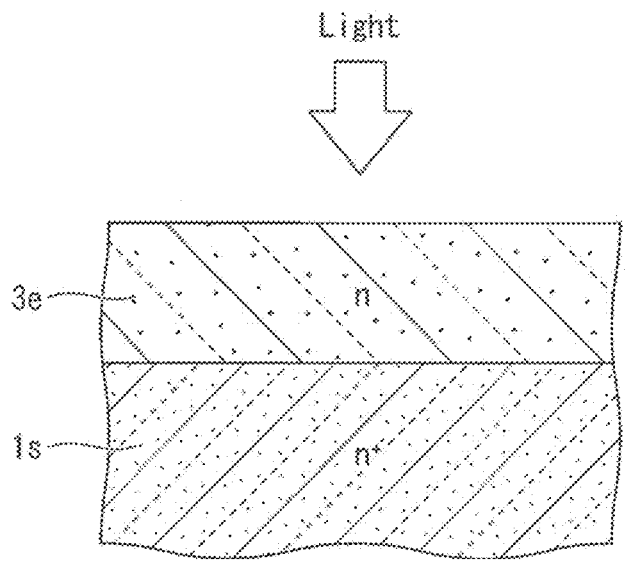
FIG. 20 is a cross-sectional view illustrating an example of the method for manufacturing the semiconductor device according to the embodiment of the present invention.

In Step S51, a process for expanding a stacking fault which may begin from a basal plane dislocation, is executed at a temperature lower than 400 degrees Celsius, for example, an ordinary temperature. As illustrated in FIG. 20, the expanding process is executed by uniformly irradiating the entire surface of the epitaxial layer 3e with a light—first light—. The irradiation light is a UV light having a wavelength less than the absorption-edge wavelength of 388 nanometers that is the band gap energy of the 4H-SiC crystal. As a light source, a UV laser and a UV lamp are used. As the UV laser, an excimer laser, an argon ion (Ar$^+$) laser, or the like can be used. As the UV laser, a third or fourth harmonic of an yttrium aluminum garnet (YAG) laser or an yttrium vanadate (YVO$_4$) laser may be used. As the UV lamp, a mercury lamp, a xenon lamp, a metal halide lamp, a deuterium lamp, a halogen lamp, or the like may be used. When a beam diameter is smaller than a surface size of the epitaxial layer 3e, the irradiation light may be scanned so as to uniformly irradiate the entire surface of the epitaxial layer 3e with the light.

Since an intensity of the irradiated light depends on the wavelength of the light and the thickness of the epitaxial layer 3e, it is preferable to satisfy the following inequality conditions at the ordinary temperature. Assuming that the threshold value of the hole concentration at which the basal plane dislocation begins to develop into the stacking fault is $1 \times 10^{15}$ per cubic centimeter, $$I(1-e^{\alpha t})/(hc/\lambda) > 1 \times 10^{15} \times t \quad (1)$$

Here, "I" is the light intensity per unit time (watt per square centimeter), "α" is the absorption coefficient of the 4H-SiC crystal (per centimeter), and "t" is the thickness (centimeter) of the epitaxial layer 3e. "h" is Plank's constant (joule second), "c" is light velocity (centimeter per second), and "λ" is wavelength (centimeter) of the irradiated light. When a pulsed laser or the like having a high irradiation energy density is used, ablation of the SiC crystal may occur. When using the excimer laser having a wavelength of 246 nanometers and a pulse width of ten nanoseconds, for example, the ablation occurs at a light intensity of about $4 \times 10^7$ watts per square centimeter. Therefore, particularly when using a pulsed laser or the like, it is preferable to execute the irradiation with a light intensity at which the ablation may not occur. Further, since a continuous-wave oscillation (CW) laser has an irradiation energy which is not so high as to cause ablation of SiC, it is preferable to use the CW laser as the irradiation light. In the embodiment, the UV light having a wavelength of 365 nm—Ar$^+$ laser—and a light intensity of one watt per square centimeter is used.

Figure 21:
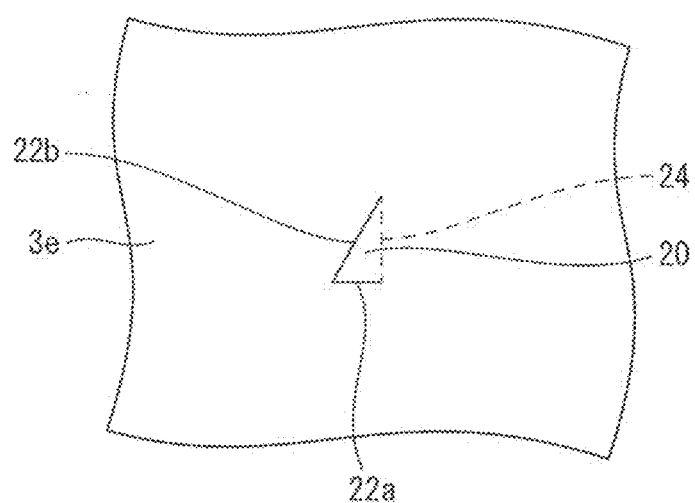
FIG. 21 is a top view subsequent to FIG. 20 illustrating an example of the method for manufacturing the semiconductor device according to the embodiment of the present invention.

When the light irradiation is continued, as illustrated in FIG. 21, the stacking fault 20 develops in the epitaxial layer 3e beginning from the basal plane dislocation propagated from the substrate 1s to the epitaxial layer 3e. The stacking fault 20 has a triangle shape, surrounded by C-cores 22a, 22b and a surface end 24. Under the irradiation condition of the embodiment, the stacking fault 20 sufficiently expands at an irradiation time of about one hour, and a length of the C-core 22a is about 140 micrometers. It is possible to confirm whether the stacking fault 20 fully expands by observing a PL image in the process of light irradiation. Observation of the PL image may be executed by using an optical filter—band pass filter—that transmits only the wavelength near the emission wavelength of about 428 nanometers from the electronic-state level of the stacking fault 20.

Figure 22:
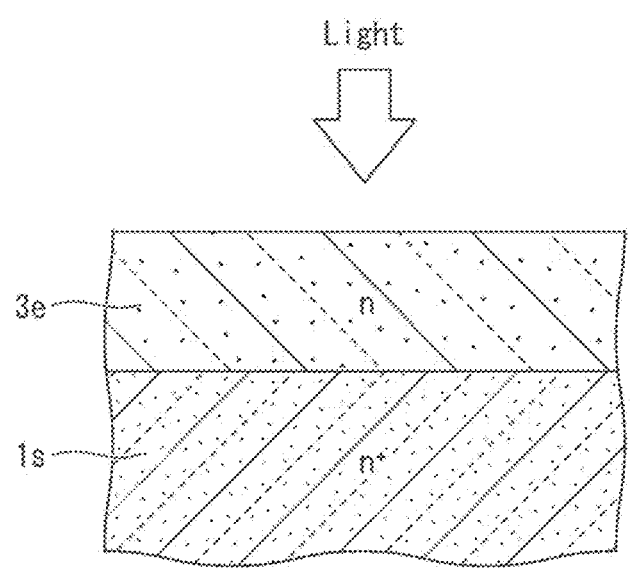
FIG. 22 is a cross-sectional view subsequent to FIG. 21 illustrating an example of the method for manufacturing the semiconductor device according to the embodiment of the present invention.
Figure 23:
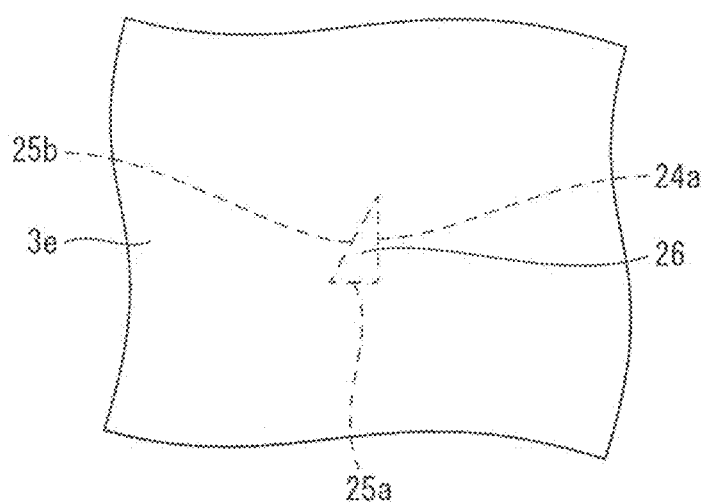
FIG. 23 is a top view subsequent to FIG. 22 illustrating an example of the method for manufacturing the semiconductor device according to the embodiment of the present invention.

After confirming that the stacking fault 20 fully expands, in Step S52, as illustrated in FIG. 22, a process for shrinking the stacking fault 20 is executed. When the shrinking process is executed in the atmosphere, the epitaxial substrate (1s, 3e) is heated at a shrinking temperature of 800 degrees Celsius or less and 400 degrees Celsius or more in order to prevent oxidation of the crystal. For the heating process, the epitaxial substrate (1s, 3e) may be directly heated, or the entire atmosphere of the epitaxial substrate (1s, 3e) may be heated. In the embodiment, the shrinking process is executed in the atmosphere, the shrinking temperature is, for example, 430 degrees Celsius, and the shrinking time is about two hours. When the shrinking process is executed in an inert gas, such as nitrogen gas (N$_2$) or the like, the oxidation of the SiC crystal may not occur, so the shrinking process may be executed at a shrinking temperature of 800 degrees Celsius or more and 1000 degrees Celsius or less. When the shrinking temperature is higher than 1000 degrees Celsius, it is not preferable because the C-core may be also mobile. After the shrinking process, as illustrated in FIG. 23, a crystallized region 26 of 4H-SiC which has been generated and developed in the stacking fault 20 is formed. Here, the epitaxial substrate (1s, 3e) may be irradiated with a light—second light—having a wavelength equal to or less than the absorption edge wavelength of SiC during the shrinking process. As a result, it is possible to decrease the shrinking time. The irradiation condition required for the second light may be the same as the first light. The same light source as the first light may be used for the second light.

In Step S53, it is determined whether or not the stacking fault 20 has been transformed to the crystallized region 26 and sufficiently shrunk. The shrinkage determination of the stacking fault 20 can be confirmed by observing the PL image using only the wavelength near the emission wavelength of about 428 nanometers described above. As illustrated in FIG. 23, boundaries 25a, 25b, 24a which are caused by residual impurities or the shrunk stacking fault 20 are observed in the PL image in trails of the C cores 22a, 22b and the surface end 24. PL from the crystallized region 26 is not observed.

In Step S54, the surface of the epitaxial layer 3e is irradiated with a light at a temperature lower than 400 degrees Celsius, for example, at the ordinary temperature, and it is determined whether the stacking fault 20 will be developed. The irradiation light is a UV light having a wavelength less than the absorption edge wavelength of 388 nanometers. In observing the PL image, if it can be confirmed that the stacking fault 20 does not expand, the process advances to Step S56. When the stacking fault 20—specific stacking fault—is confirmed to expand, in Step S55, the epitaxial substrate (1s, 3e) is heated to the shrinking temperature, for example 430 degrees Celsius, so that the specific stacking fault is irradiated with a light—third light—having a wavelength equal to or less than the absorption edge wavelength of SiC. The irradiation condition required for the third light are the same as the first light, and the irradiation of the third light can be executed with the same configuration as in FIG. 22. Since the position of the specific stacking fault is known, it is also possible to use a laser beam as the third beam and to directly irradiate the specific stacking fault. The crystallized region 26 which has been generated in the specific stacking fault is developed by heating at the shrinking temperature and by irradiation with the UV light. The temperature of the epitaxial layer 3e is lowered to a temperature less than 400 degrees Celsius and irradiation of UV light for PL excitation is executed. Then, it is confirmed that the specific stacking fault does not expand by observation of the PL image. Although the processes of Step S53 to Step S55 are not essential, it is possible to execute the processes once or a plurality of times so as to enhance the effectiveness of preventing the expansion of stacking fault.

Figure 24:
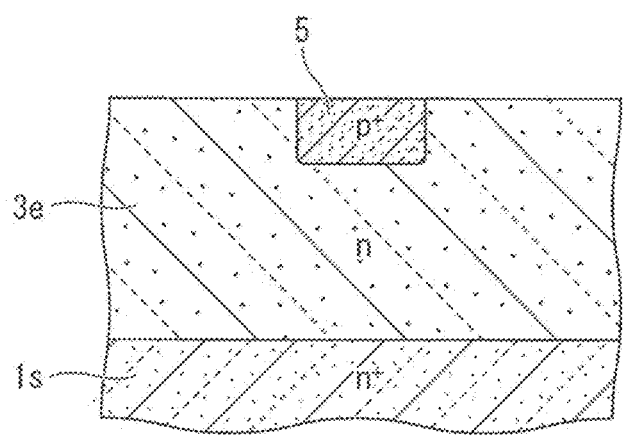
FIG. 24 is a cross-sectional view subsequent to FIG. 23 illustrating an example of the method for manufacturing the semiconductor device according to the embodiment of the present invention.

Thereafter, in Step S56, a p-type carrier-injection region 5 in which impurities of Al or the like are doped, is selectively formed on the epitaxial layer 3e as illustrated in FIG. 24. For example, a mask for ion implantation may be formed by photolithography, and impurity ions, such as Al and the like, which shall manifest p-type conductivity, may be implanted into the epitaxial layer 3e at a high impurity concentration. Subsequently, the lower surface of the substrate 1s is polished by chemical mechanical polishing (CMP) or the like and a carrier-extraction layer 1 is finished to have a specified dimension as a cathode region by adjusting a thickness. A bottom-surface electrode 9—cathode electrode 9—made of Au or the like is formed on the bottom surface of the carrier-extraction layer 1 by sputtering or vacuum evaporation. Further, a metallic film, such as Al and the like, is deposited by sputtering or vacuum evaporation to form a top-surface electrode 7—anode electrode 7—. As mentioned above, the semiconductor device according to the embodiment of the present invention illustrated in FIG. 1 is completed.

In the method of manufacturing a semiconductor device according to the embodiment of the present invention, a crystallized region 26 of 4H-SiC is formed in the stacking fault 20 at the shrinking temperature of 400 degrees Celsius or more. The shrinking temperature is a temperature in which the energy level of the crystallized region 26 of 4H-SiC is lower than the energy level of the stacking fault 20. Since the stacking fault 20, which has shrunk due to the development of the crystallized region 26, is surrounded by the C-cores, the stacking fault 20 is immobilized and it is possible to prevent the stacking fault 20, which has shrunk by current flow or UV irradiation, from re-expanding.

Thickness and impurity concentration of the carrier-transport layer 3, which serves as the "i-layer" in the p-i-n diode, may be changed according to the design-specification for breakdown voltage of the p-i-n diode. The thickness of the carrier-transport layer 3 is, for example, about five micrometers to several hundreds micrometers for a range of the breakdown voltage of 600 volts to several ten kilovolts. Since a light having a wavelength equal to or less than the absorption edge wavelength of 4H-SiC is absorbed by the SiC crystal, a penetration depth of the light into the crystal is limited. For example, the penetration depth of the light having a wavelength of 310 nanometers is about ten micrometers, while the penetration depth of the light having a wavelength of 250 nanometers is as shallow as about one micrometer. Since the basal plane dislocation which serves as the starting point of the stacking fault, is present in the vicinity of the interface between the carrier-extraction layer 1 and the carrier-transport layer 3, it is desirable to use the UV light having a wavelength such that the penetration depth is approximately equal to the thickness of the carrier-transport layer 3, in order to expand the stacking fault 20. In the case of the UV light having a wavelength of 250 nanometers, although the penetration depth is about one micrometers, since the diffusion length of hole which is the minority carrier, is about ten micrometers, it is possible to use for expanding the stacking fault 20.

Further, in the design-specification where the carrier-transport layer 3 needs to have a thickness of about 100 micrometers, there is a case where expansion of the stacking fault is executed using a UV light having a wavelength of about 300 nanometers or less. In such case, a base epitaxial layer having a penetration depth of the UV light, for example, about ten micrometers, is grown on the substrate 1s, and the expansion and shrinkage processes of the stacking fault 20 is executed so as to immobilize the stacking fault 20. Thereafter, an additional epitaxial layer having a thickness of about 90 micrometers is further grown on the base epitaxial layer to prepare epitaxial substrate (1s, 3e). Since the stacking fault 20 is immobilized in the base epitaxial layer, expansion of the stacking fault 20 into the additional epitaxial layer by current flow or light irradiation can be prevented.

Modification

Figure 25:
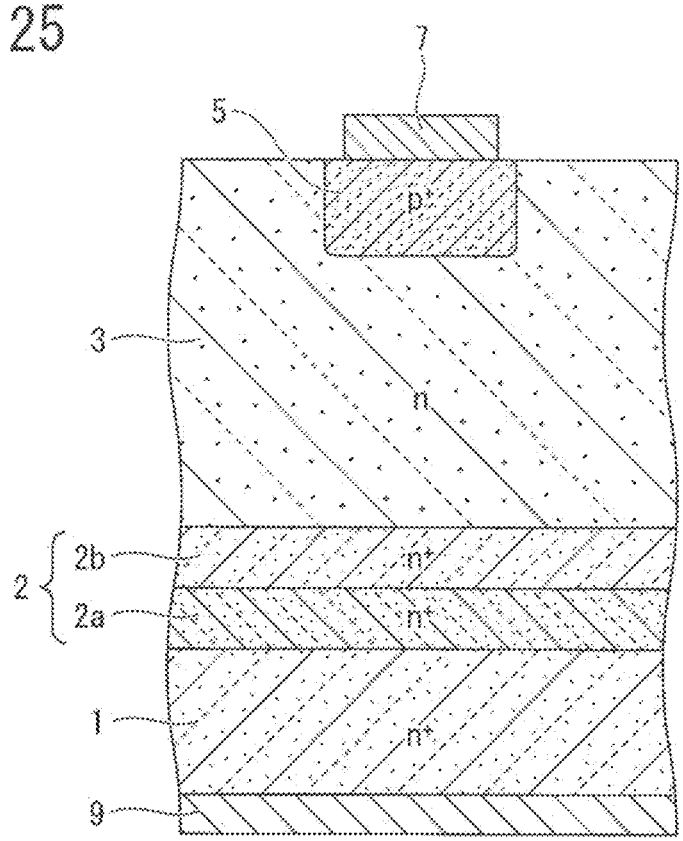
FIG. 25 is a cross-sectional view of an essential part illustrating an example of a semiconductor device according to a modification of the embodiment of the present invention.

As illustrated in FIG. 25, a semiconductor device pertaining to a modification of the embodiment of the present invention includes an $n^+$-type carrier-extraction layer 1, an $n^+$-type buffer layer 2, an n-type carrier-transport layer 3, a $p^{+/}$-type carrier-injection region 5, an anode electrode 7, and a cathode electrode 9. The buffer layer 2 is provided between the carrier-extraction layer 1 and the carrier-transport layer 3 and includes a defect-conversion layer 2a for converting the basal plane dislocation into the threading dislocation, and a recombination-promoting layer 2b for decreasing minority carriers injected from a side of the carrier-transport layer 3 to a side of the carrier-extraction layer 1. In FIG. 25, the buffer layer 2 having a multilayer structure, or a composite structure, of the defect-conversion layer 2a and the recombination-promoting layer 2b is illustrated, but the modification of the embodiment is not limited to the structure illustrated in FIG. 25. For example, the buffer layer 2 may have a single layer structure of only a defect-converting layer or a single layer structure of only a recombination-promoting layer. The modification of the embodiment is different from the above exemplified embodiment in that the buffer layer 2 is provided between the carrier-extraction layer 1 and the carrier-transport layer 3. Since other configurations are the same as those in the above exemplified embodiment, redundant description will be omitted.

In the semiconductor device according to the modification of the embodiment, the basal plane dislocations are converted to the threading dislocations by about 95% in the defect-conversion layer 2a grown on the carrier-extraction layer 1. Further, in the recombination-promoting layer 2b grown on the defect-conversion layer 2a, the holes injected from the p+-type carrier-injection region 5 by current flow are recombined with electrons. As described above, in the modification of the embodiment, the basal plane dislocations propagated from the carrier-extraction layer 1 reside in the defect-conversion layer 2a. The thicker the defect-conversion layer 2a, the lower the occurrence frequency of stacking faults. However, if the defect-conversion layer 2a is made thicker, it will lower the throughput of epitaxial growth, and thus, it is desirable to decrease the thickness of the defect-conversion layer 2a to one micrometer or less. In addition, in order to reduce the hole concentration injected into the basal plane dislocation residing in the defect-conversion layer 2a, it is desirable to use an n+-type epitaxial layer having a higher impurity concentration than the carrier-transport layer 3 for the defect-conversion layer 2a. Furthermore, in order to decrease the threshold value of the hole concentration to $1 \times 10^{15}$ per cubic centimeter or less, the n+-type recombination-promoting layer 2b is added. In the recombination-promoting layer 2b, in addition to the n-type dominant impurity, a secondary impurity forming a hole-trap level is doped. The higher the impurity concentration of the dominant impurity, the lower the hole concentration. For the secondary impurity, Al, boron (B), vanadium (V), titanium (Ti), iron (Fe), chromium (Cr) and the like may be used.

Figure 26:
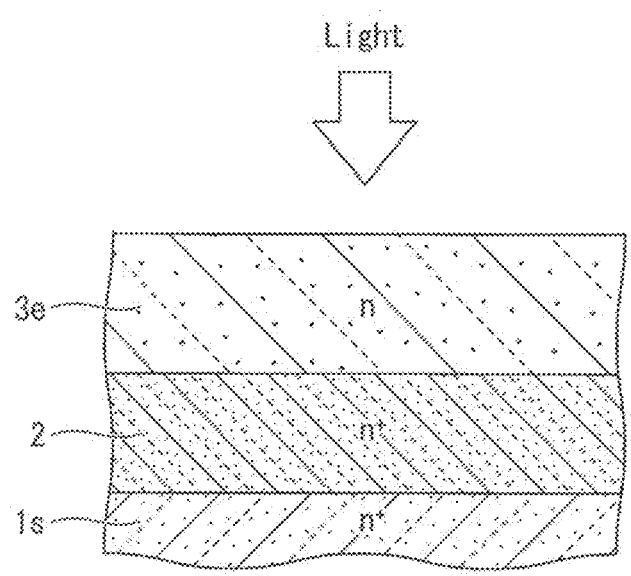
FIG. 26 is a cross-sectional view illustrating an example of a method for manufacturing the semiconductor device according to the modification of the embodiment of the present invention.
Figure 27:
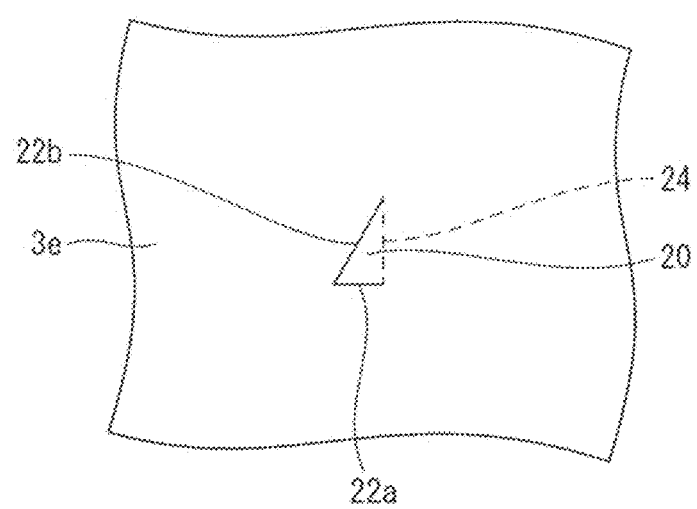
FIG. 27 is a top view subsequent to FIG. 26 illustrating an example of the method for manufacturing the semiconductor device according to the modification of the embodiment of the present invention.

Next, with reference to the process diagrams illustrated in FIGS. 26 and 27, a method for manufacturing a semiconductor device according to the modification of the embodiment will be described by using a p-i-n diode as an example. First, as illustrated in FIG. 26, an n+-type buffer layer 2 and an n-type epitaxial layer 3e are epitaxially grown in series on an n+-type substrate 1s of a 4H-SiC crystal by an epitaxial growth technique and the like. The substrate 1s is a (0001)Si plane in which a principal surface is off by four degrees in the <11-20> direction. The buffer layer 2 is doped with n-type impurity atoms, such as nitrogen (N) and the like, at an impurity concentration of about $1 \times 10^{18}$ per cubic centimeter to $1 \times 10^{19}$ per cubic centimeter. The epitaxial layer 3e is doped with n-type impurity atoms at a lower impurity concentration than the buffer layer 2. The thicknesses of the buffer layer 2 and the epitaxial layer 3e are, for example, about one micrometer and about ten micrometers, respectively.

As illustrated in FIG. 26, the entire surface of the epitaxial layer 3e is uniformly irradiated with a light—first light—at an ordinary temperature, and the stacking fault beginning from the basal plane transition is developed. An Ar+ laser light having a wavelength of 365 nanometers and a light intensity of one watt per square centimeters is used for the irradiation light. When light irradiation is continued, as illustrated in FIG. 27, the stacking fault 20 expands in the epitaxial layer 3e beginning from the basal plane dislocation propagated from the substrate 1s to the buffer layer 2. The stacking fault 20 has a triangle shape surrounded by C-cores 22a, 22b and a surface end 24.

After confirming that the stacking faults 20 has sufficiently expanded by the PL image, the epitaxial layer 3e is heated to a shrinking temperature of, for example, about 430 degrees Celsius for two hours so as to execute the shrinking process for the stacking fault 20. It is determined whether the stacking fault 20 is transformed into the crystallized region 26 so as to sufficiently reduce by the PL image. Thereafter, the epitaxial layer 3e is irradiated with a light at the ordinary temperature to determine whether the stacking fault will expand or not. The irradiation light is a UV light such as the Ar+ laser. When the stacking fault 20—specific stacking fault—is confirmed to expand by irradiation with the UV light, the epitaxial layer 3e is heated to the shrinking temperature, for example 430 degrees Celsius, so that the specific stacking fault is irradiated with a light—third light—having a wavelength equal to or less than the absorption edge wavelength of SiC. A crystallized region generated within the specific stacking fault by the irradiation with the third light is developed by heating at the shrinking temperature. The epitaxial layer 3e is lowered to the ordinary temperature and irradiated with the UV light for PL excitation so as to confirm by observation of the PL image that the specific stacking fault does not expand.

Thereafter, a carrier-injection region 5 in which p-type impurity ions such as Al are implanted with a high impurity concentration is selectively formed on the epitaxial layer 3e by photolithography, ion implantation or the like. Subsequently, the lower surface of the substrate 1s is polished and adjusted in thickness by CMP or the like to form a carrier-extraction layer 1. A cathode electrode 9 made of Au or the like is formed on the bottom surface of the carrier-extraction layer 1 by sputtering or vacuum evaporation or the like. Further, a metallic film, such as Al and the like, is deposited by sputtering or vacuum evaporation to form an anode electrode 7. Thus, the semiconductor device according to the modification of the embodiment illustrated in FIG. 25 is completed.

In the modification of the embodiment, the n+-type buffer layer 2 is epitaxially grown on the substrate 1s. Therefore, the basal plane dislocations propagating from the substrate 1s are converted into the threading dislocations in the buffer layer 2. In addition, the buffer layer 2 is doped with the n-type impurity having a higher impurity concentration than the epitaxial layer 3e. Therefore, the hole concentration injected from the epitaxial layer 3e into the basal plane dislocations residing at the interface between the substrate is and the buffer layer 2 may be reduced to $1 \times 10^{15}$ per cubic centimeter or less, which is the threshold value of the hole concentration. As a result, it is possible to prevent enlargement of the basal plane dislocations from expanding to the stacking faults.

Other Embodiments

While the present invention has been described above by reference to the embodiment, it should be understood that the present invention is not intended to be limited to the descriptions of the specification and the drawings implementing part of this disclosure. Various alternative embodiments, examples, and technical applications will be apparent to those skilled in the art according to this disclosure.

As described above, the description has been given using the 4H-SiC crystal in the embodiment, but it is also possible to use a polytype, such as a cubic 3C-SiC, a hexagonal 6H-SiC and the like.

As described above, it should be noted that the present invention includes various embodiments which are not disclosed herein. Therefore, the scope of the present invention is defined only by the technical features specifying the present invention, which are prescribed by claims, the words and terms in the claims shall be reasonably construed from the subject matters recited in the present Specification.

What is claimed is:
1. A method for manufacturing a semiconductor device, comprising:
   epitaxially growing a carrier-transport layer of a first conductivity type on a substrate of silicon carbide;

irradiating the carrier-transport layer with a first light having a wavelength equal to or less than an absorption-edge wavelength of silicon carbide at a temperature of less than 400° C. so as to expand a stacking fault originating from a basal plane dislocation which are propagated from the substrate to the carrier-transport layer;

heating the carrier-transport layer in which the stacking fault has expanded so as to shrink the stacking fault, at a shrinking temperature of 400° C. or more and 1000° C. or less; and after heating the carrier-transport layer in which the stacking fault has expanded so as to shrink the stacking fault, forming a carrier-injection region of a second conductivity type on the carrier-transport layer, the carrier-injection region being provided to inject carriers into the carrier-transport layer.

2. The method according to claim 1, wherein the shrinking the stacking fault is executed while irradiating the carrier-transport layer with a second light having a wavelength equal to or less than the absorption edge wavelength.

3. The method according to claim 2, further comprising:
detecting a specific stacking fault which expands into the carrier-transport layer from the stacking fault which have been shrunk after the shrinking the stacking fault;
irradiating the specific stacking fault with a third light having a wavelength equal to or less than the absorption edge wavelength while heating the carrier-transport layer at the shrinking temperature; and
heating a crystal region, which is generated in the specific stacking fault by the irradiating with the third light, at the shrinking temperature so as to expand the crystal region.

4. The method according to claim 1, wherein the shrinking the stacking fault is executed in an atmosphere in a range of the shrinking temperature of 400° C. or more and 800° C. or less.

5. The method according to claim 2, wherein the first light and the second light are simultaneously irradiated on an entire surface of the carrier-transport layer, respectively.

6. The method according to claim 2, wherein the first light and the second light are irradiated while scanning an entire surface of the carrier-transport layer with an irradiation area smaller than a surface area of the carrier-transport layer.

7. The method according to claim 6, wherein each of the first and second lights is a laser light.

8. The method according to claim 3, wherein the third light is a laser light with which the specific stacking fault is irradiated.

9. The method according to claim 3, wherein a surface area of the carrier-transport layer, in which the specific stacking fault is included, is irradiated with the third light.

10. The method according to claim 3, wherein each of the first to third lights has an ultraviolet-radiation-intensity of 1 W/cm2 or more, with which a surface region of the carrier-transport layer does not ablate.

11. A method for manufacturing a semiconductor device, comprising:
epitaxially growing a carrier-transport layer of a first conductivity type on a substrate of silicon carbide;
irradiating the carrier-transport layer with a first light having a wavelength equal to or less than an absorption-edge wavelength of silicon carbide at a temperature of less than 400° C. so as to expand a stacking fault originating from a basal plane dislocation which are propagated from the substrate to the carrier-transport layer, the expansion of the stacking fault being detected by acquiring a photoluminescence image of the stacking fault during the irradiating the carrier-transport layer with the first light; and
heating the carrier-transport layer in which the stacking fault has expanded so as to shrink the stacking fault, at a shrinking temperature of 400° C. or more and 1000° C. or less.

12. The method according to claim 1, wherein the substrate is any polytype of 4H, 6H, and 3C.

13. A method for manufacturing a silicon carbide epitaxial substrate comprising:
growing an epitaxial layer on a silicon carbide substrate;
irradiating the epitaxial layer with a first light having a wavelength equal to or less than an absorption-edge wavelength of silicon carbide at a temperature of less than 400° C. so as to expand a stacking fault originating from a basal plane dislocation which is propagated from the substrate to the epitaxial layer; and
heating the epitaxial layer in which the stacking fault has expanded while irradiating the epitaxial layer with a second light having a wavelength equal to or less than the absorption edge wavelength, so as to shrink the stacking fault, at a shrinking temperature of 400° C. or more and 1000° C. or less.

14. The method according to claim 1, wherein
heating the carrier-transport layer in which the stacking fault has expanded so as to shrink the stacking fault, is executed in an inert gas, and
the shrinking temperature is 800° C. or more and 1000° C. or less.

* * * * *